(12) United States Patent
Van Gastel

(10) Patent No.: US 9,464,921 B2
(45) Date of Patent: Oct. 11, 2016

(54) METHOD FOR THE OPERATION OF A CAPACITIVE SENSOR ARRAY ON A MOTOR VEHICLE AND ASSOCIATED DEVICE

(71) Applicant: Peter Van Gastel, Solingen (DE)

(72) Inventor: Peter Van Gastel, Solingen (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 209 days.

(21) Appl. No.: 14/376,766

(22) PCT Filed: Jan. 14, 2013

(86) PCT No.: PCT/EP2013/050584
§ 371 (c)(1),
(2) Date: Aug. 5, 2014

(87) PCT Pub. No.: WO2013/117386
PCT Pub. Date: Aug. 15, 2013

(65) Prior Publication Data
US 2015/0002175 A1    Jan. 1, 2015

(30) Foreign Application Priority Data

Feb. 6, 2012 (DE) .......................... 10 2012 100 960

(51) Int. Cl.
*G01D 5/24* (2006.01)
*H03K 17/955* (2006.01)
(Continued)

(52) U.S. Cl.
CPC ............ *G01D 5/2405* (2013.01); *E05F 15/73* (2015.01); *H03K 17/955* (2013.01);
(Continued)

(58) Field of Classification Search
CPC .... G01D 5/24; G01D 5/2405; H03K 17/955; H03K 2017/9602; H03K 2217/96078; B60R 25/2054; E05Y 2900/546; E05Y 2400/858; E05Y 2400/852; E05F 15/20; E05F 15/46; E05F 15/73
See application file for complete search history.

(56) References Cited

U.S. PATENT DOCUMENTS

| 5,730,165 | A | 3/1998 | Philipp |
| 9,081,032 | B2* | 7/2015 | Lange ................. B60R 25/2045 |
| 2012/0319502 | A1* | 12/2012 | Van Gastel ............ B60R 25/20 307/116 |

FOREIGN PATENT DOCUMENTS

| DE | 19681725 B4 | 4/2007 |
| DE | 102009025212 A1 | 4/2010 |

(Continued)

OTHER PUBLICATIONS

International Search Report of International Application No. PCT/EP2013/050584 dated Apr. 24, 2013, 4 pages.

(Continued)

*Primary Examiner* — Son Le
(74) *Attorney, Agent, or Firm* — Fay Sharpe LLP

(57) ABSTRACT

A sensor array for the detection of movement gestures on a motor vehicle includes two elongated sensor electrode arrays offset from each other on the motor vehicle. At least one control and evaluation device is coupled to the arrays and detects a change in their capacitance. A longer array is deformed in the direction of a shorter array where the longer array protrudes over the shorter array. The control and evaluation device is designed to detect a time sequence of capacitance values for each of the arrays. The times when each array responds and stops responding are recorded, as is the time difference between the times when the arrays respond (response time difference), and the time difference between the times when the arrays stop responding (dropout time difference). These are compared when assessing whether an actuation event has been recorded by the control and evaluation device.

8 Claims, 2 Drawing Sheets

(51) Int. Cl.
*E05F 15/73* (2015.01)
*H03K 17/96* (2006.01)
*B60R 25/20* (2013.01)
*E05F 15/46* (2015.01)

(52) U.S. Cl.
CPC .......... *B60R 25/2054* (2013.01); *E05F 15/46* (2015.01); *E05Y 2400/852* (2013.01); *E05Y 2400/858* (2013.01); *E05Y 2900/546* (2013.01); *H03K 2017/9602* (2013.01); *H03K 2217/96078* (2013.01)

(56) References Cited

FOREIGN PATENT DOCUMENTS

| DE | 102008063366 A1 | 7/2010 |
|---|---|---|
| DE | 102010018164 A1 | 8/2011 |
| DE | 102010002559 A1 | 9/2011 |
| DE | 102010011767 A1 | 9/2011 |
| DE | 102010045422 A1 | 11/2011 |
| DE | 102010049400 A1 | 4/2012 |
| DE | 102011008277 A1 | 7/2012 |
| EP | 1339025 A1 | 8/2003 |
| WO | WO 01/08925 A1 | 2/2001 |
| WO | WO 2012/052210 A1 | 4/2012 |

OTHER PUBLICATIONS

German Search Report of Priority German Application No. 10 2012 100 960.0 dated Jan. 11, 2013, 6 pages.
International Preliminary Report on Patentability and Written Opinion of International Application No. PCT/EP2013/050584 dated Aug. 21, 2014 and English Translation, 17 pages.

* cited by examiner ta2-1  ta3-1   ta3-2   ta2-2 tb2-1  tb3-1  tb3-2   tb2-2

METHOD FOR THE OPERATION OF A CAPACITIVE SENSOR ARRAY ON A MOTOR VEHICLE AND ASSOCIATED DEVICE

BACKGROUND

The invention relates to a capacitive sensor array with multiple sensor electrodes, by means of which the penetration of an object into a room is detected in front of the sensor electrodes, and to a control and evaluation device, which is coupled to the sensor electrodes and detects a change in the capacitance of the sensor electrodes in relation to the reference potential.

For example, the U.S. Pat. No. 5,730,165 or respective patent specification DE 196 81 725 B4 discloses a capacitive sensor array with a sensor electrode, by means of which the approach of an object shall be detected, and with a control and evaluation device, which is coupled to the sensor electrode and detects a change in the capacitance of the sensor electrode in relation to mass by coupling the sensor electrode which has a predetermined frequency in periodically repeated fashion with an operating voltage and evaluating at least one parameter of a current or voltage curve which depends on the periodic charging and discharging of the sensor electrode for detecting the capacitance change. At the same time, the parameter of a current or voltage curve depending on periodic charging and discharging of the sensor electrode is a voltage that can be measured via a capacitor, the voltage depending on the charge accumulated on the capacitor, wherein said charge was accumulated in that in periodically repeated fashion the sensor electrode was charged by being coupled to the operating voltage and then discharged via the capacitor by being coupled to the capacitor. Another such capacitive sensor has been disclosed in patent specification EP 1 339 025 B1.

DE 10 2008 063 366 describes a generic device for contact-free actuation of a hatchback of a motor vehicle, which has a first sensor electrode for detecting an object in a first detection range and a second sensor electrode for detecting an object in a second detection range so that the actuation of the hatchback can be activated via the recognition means.

The contact-free actuation of a hatchback can be used, for example, when a person carries items with both hands and a manual actuation of the hatchback is not possible or possible only with difficulty. The object detected by the sensor electrodes can involve a person that approaches the motor vehicle with the intention of actuating the hatchback. At the same time, the actuation of the hatchback describes an opening process, for example, when the person wants to place an item with both hands into the trunk, as well as a closing process of the hatchback when the person has removed an item with both hands from the trunk. The detection includes a body movement, which relates, for example, to the person lifting or swinging the leg or foot in the range of the outer area of the motor vehicle monitored by the sensor array. Disadvantageously, it is possible that a signal for the actuation of the hatchback is triggered even when it does not involve the leg or foot of the particular person. For example, animals can pass the range of the outer area of the motor vehicle monitored by the sensor array, or an object, for example, a ball, can run or roll through the monitored outer area. In addition, it is desired to exclude unclear actuation gestures to increase the detection accuracy.

Therefore, it is desirable to avoid defective function of the hatchback of the motor vehicle.

It is therefore the object of the invention to provide a reliable sensor and evaluation system which reduces the error detection of actuation requirements.

BRIEF SUMMARY

According to the invention, this object is achieved by means of a capacitive sensor array with the characteristics of Claim 1 and a method with the characteristics of Claim 5.

The invention-based sensor array has first and second sensor electrodes by means of which the penetration of an object into a room shall be detected prior to the sensor electrodes. The two sensor electrode arrays are arranged at spatially offset positions on the motor vehicle. Both sensor electrodes are designed as elongate electrode arrays and disposed with the same spatial orientation. At least one control and evaluation device (5), which detects a change in the capacitance of the sensor electrode arrays in relation to a reference potential, is coupled to the sensor electrode arrays.

One of the sensor electrode arrays is longer than the other sensor electrode array, wherein the longer sensor electrode array extends in longitudinal direction on both sides over the shorter sensor electrode array. According to the invention, one sensor electrode array is at least partially offset in relation to the other sensor electrode array, for example, in a lower or higher area of the shock absorber. The design of the sensor electrode array is not important for the invention. For example, they can involve coaxial cables with appropriate wiring, as described in DE 10 2010 045 422 A1.

In the horizontal overlapping area, the sensor electrode arrays have a vertical space, i.e., they are arranged on top of each other.

In the area of the portions protruding in horizontal direction over the shorter sensor electrode array, the longer sensor electrode array is deformed in the direction of the relatively vertical position of the shorter sensor electrode array.

As described above, in sections the electrodes are arranged to be offset in vertical direction. In the area of horizontal extension of the electrodes, which is covered by both electrodes, one of the electrodes is arranged in vertical fashion above the other. Vertically above another means that in a projection on a vertical plane there is a sectionwise offset between the projections of the electrodes.

At the same time, the electrodes can also be arranged to be offset against each other in a horizontal direction which is situated vertically to its direction of extension. For example, an electrode can be arranged closer to the rear end while the other electrode is offset further toward the interior of the vehicle. This offset can differ over the extension of the electrodes.

In the sections which protrude over the shorter electrode, the longer electrode is vertically deformed or extends in the direction of the shorter electrode. For example, when the shorter electrode is arranged centrally at the rear end of the motor vehicle and the longer one is arranged vertically above said shorter electrode, the upper longer electrode protrudes laterally over the shorter electrode. In these sections, which protrude laterally, the longer electrode extends vertically in the direction of the shorter electrode, in this case downward. At the same time, the outer portions of the longer electrode can extend to the level of the shorter electrode or even below. Any type of deformation can be used; the curvature can extend vertically downward, it can involve a gradual, inclined and bent transition with horizontal sections.

According to the invention, when viewed from the back, the electrodes extend in horizontal direction in such a way that portions of the longer electrode are situated laterally on the outer edges. Toward the center they are guided to a different vertical height and the shorter electrode is arranged in the center, but the electrodes do not overlap.

The control and evaluation device is designed to detect a time sequence of capacitance values for each of the sensor electrode arrays, and respective times when each sensor electrode array responds and stops responding are recorded. The time difference between the times when the sensor electrode arrays respond (response time difference) and the time difference between the times when the sensor electrodes stop responding (drop-out time difference) are compared when assessing whether an actuation event has been recorded by the control and evaluation device.

Furthermore, the capacitive sensor arrangement has a control and evaluation circuit coupled to the sensor electrodes which records a change in the capacitance of the sensor electrodes in relation to a reference potential.

The sensor electrode arrays are arranged in a rear bumper to monitor the area behind the bumper and in front of the bumper. The signal patterns of the first sensor electrode and the further sensor electrode array are repeatedly scanned (for example, in response to the detection of an ID transponder of a keyless-entry-system).

The detection can occur by periodically charging and discharging the sensor electrodes with a predetermined frequency and evaluating at least one parameter of a current or voltage curve which depends on periodic the charging and discharging of the sensor electrode for detecting the capacitance change. For example, the periodic charging and discharging is performed in that it couples the sensor electrode to the predetermined frequency in periodically repeated fashion with a predetermined potential, for example, the operating voltage potential. The voltage curve can involve, for example, the voltage curve at the contact of the first sensor electrode. The parameter can involve, for example, a voltage which is measured via a charge accumulating capacitor, or a specific number of periods of charging and discharging up to exceeding a switching threshold by means of a voltage measured at the first sensor electrode. The invention develops its advantageous effect all the more the shorter the detection cycles for determining a capacitance value. It is possible to evaluate the capacitances within the invention with cycles of 30 ms. However, it is advisable to perform the detection fast, with cycles of 20 ms or even shorter (app. 10 ms).

A predetermined gesture of a user, for example, a simulated kick under the bumper, should result in an opening or closing procedure. For this purpose, the signal sequences of the sensor electrodes are detected and compared with signal sequences which indicate a specific actuation of the device.

Designing the sensor electrodes with significantly different longitudinal extensions makes it possible that especially in error prone lateral areas increased detection accuracy can be ensured.

The invention-based arrangement extends the detection range of an electrode array in the direction of the longitudinal extension over the detection range of the other electrode. This results in the fact that in this area in which the sensitivity of the shorter electrode decreases, but the sensitivity of the longer electrode remains the same or even increases, a spatially inhomogeneous detection profile of the electrodes is formed which can be evaluated. In addition, as described below, the detection can be improved by designing the outer regions of the longer electrode in the direction of the shorter electrode.

Because of the limited physical expansion, the detection range of the shorter electrode array is more concentrated to the mutual longitudinal range covered by both electrode arrays, which are usually located in the center of the motor vehicle. In the lateral areas, primarily or even only the longer sensor electrode is sensitive. Since the position of the electrodes on the vehicle is known, it is easier to differentiate the signals of the electrodes. For example, if a signal change is detected first or only on the longer electrode, an unspecified release is indicated. That is to say the desired detection range is located in the area of the mutually covered area of longitudinal extension of both electrodes. It would not be useful to shorten both electrodes because, although the detection range would be reduced, it would not allow for a differentiation in the edge regions.

The invention-based device allows for different types of evaluation, on the one hand, via the signal strength of both electrodes and, on the other hand, via the signal sequence.

According to the invention, the signal sequence of the sensor electrodes is analyzed in a multi-stage process. At the same time, it can be assumed that for detecting an actuation always a signal change of both electrodes is recorded because otherwise the actuation is not valid. The capacitance values of each electrode change from a respective repose value when detecting an actuation to an extreme value and then return to the repose value. An actuation is only detected when the signals of both electrodes receive a significant change in value in relation to the repose value, i.e., increase via a threshold value (or decrease via a threshold value, depending on the evaluation method). In the scope of this application, this significant increase is depicted as "response time". The time when the measuring value decreases to the range of the repose value, i.e., below the triggering threshold, is depicted as "drop-out time". However, in the scope of the invention, the response time or the drop-out time can be also defined in a way different from a threshold value.

According to the invention, for each electrode the time is recorded when this particular electrode responds, for example, when it overlaps the predetermined threshold value.

It is recorded:
when the first electrode responds, for example, when the signal of the first electrode exceeds the threshold value;
when the second electrode responds, for example, when the signal of the second electrode exceeds the threshold value;
when the first electrode stops responding, for example, when the signal of the first electrode exceeds the threshold value again;
when the second electrode stops responding, for example, when the signal of the second electrode exceeds the threshold value again.

According to the invention, in one step of the detection method it is assessed whether the signal sequence occurs with plausible time intervals. At the same time, it is assumed that only temporally approximately symmetrical processes render a correct user gesture. For this purpose, the interval between the response (exceeding of the detection threshold) of the first and second electrode is compared with the interval between the drop-out (falling below the detection threshold) of the second and first electrode.

Only when these intervals are equal, except for a tolerance value, it is possible to detect an actuation. Otherwise the evaluation is interrupted. The tolerance value is a constant or percentage time value. Relating to the interval mentioned (for example, up to 50% of the smaller time difference), a percentage time value considers the speed with which the actuation is performed. However, the tolerance value can also be derived in a different manner from the measuring values, or it can involve a tolerance value that is correlated with the recorded ID transponder and stored in the motor vehicle.

A step of detection assesses the temporal symmetry of the actuation movement on the outward and return trip. This invention-based filtering of the actuation signals detects such movements as inappropriate gestures which are performed asymmetrically. For example, when after kicking the leg under the bumper it is pulled back in a semi-circle or obliquely different comparative times are resulting.

This makes it clear that the invention-based temporal resolution is relevant because the time values are connected to this resolution. The higher the temporal resolution the more exact the assessment of the symmetry of the movement is going to be.

Moreover, in a further evaluation stage the sequence of the response of the electrodes is assessed. The signal sequence has to be consistent. This means that the electrode responding first has to be the one responding last. The electrodes have to drop with their signals below the detection limit in the opposite sequence from the way they responded.

In addition, as described below, it is also possible to perform a further differentiation via the spatial arrangement. The projection of the electrodes on both sides can be measured symmetrically, but it is not absolutely necessary.

Preferably, the length difference of the sensor electrode array amounts to between 30 and 100%. On the one hand, such a length difference ensures that a clear projection is available, which results in clear signal differences. On the other hand, there is also a significant portion of a mutual area of extension, which allows in this area for the detection, for example, of movement gestures.

BRIEF DESCRIPTION OF THE DRAWINGS

Subsequently, the invention is described by means of the enclosed figures.

FIG. 2A shows a schematic signal response when detecting an acceptable actuation movement with a sensor array from FIG. 4a;

FIG. 2B shows a schematic signal response when detecting an unacceptable actuation movement with a sensor array from FIG. 4a.

DETAILED DESCRIPTION

Figure 1A:
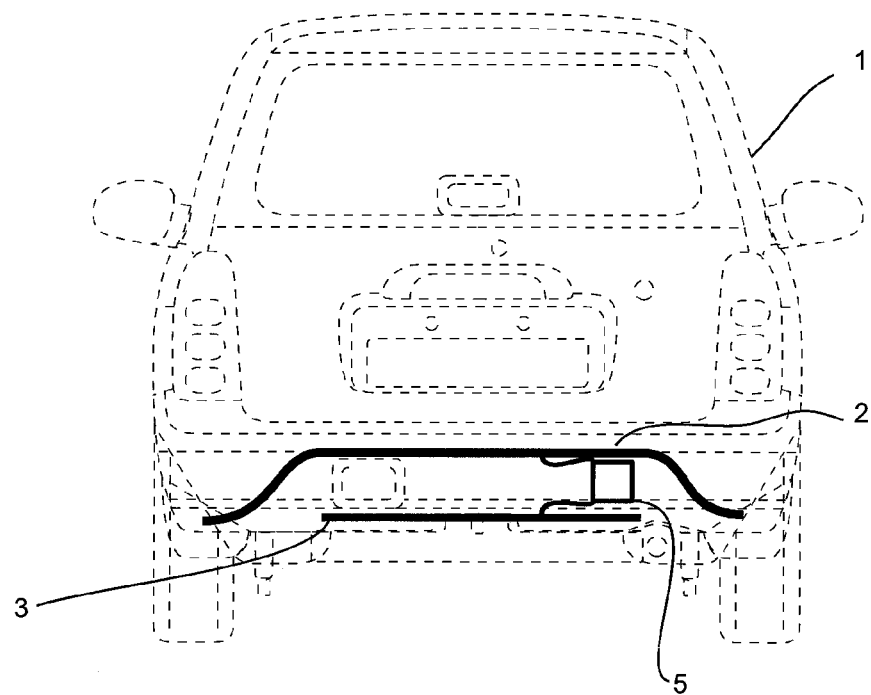
FIG. 1A shows the arrangement of a first embodiment of the invention-based sensor array on a motor vehicle.

FIG. 1A shows the rear end of a motor vehicle 1. In the area of the rear bumper a sensor electrode array 2 has been attached. Below (in lower vertical height from the ground) the sensor electrode array 2 a further sensor electrode 3 has been arranged. Each of the sensor electrodes 2 and 3 is connected to a control and evaluation device 5. This device, in turn, is coupled to a central vehicle control unit 4, which controls and releases an opening of the hatchback of the motor vehicle when the control unit 5 generates a respective signal. The electrodes are charged via the device 5 and the capacitance change of the electrodes when a body, for example, a body part of an operator, is approaching can be detected by evaluating the charge. This principle of a capacitive sensor is well-known in the field of automobile technology (see above).

The sensor electrode array 3 extends in the central section parallel to the electrode 2. However, the electrode array 2 extends further in horizontal direction than the electrode array 3 and protrudes laterally over the ends of the electrode 3. The electrodes are here entirely designed with basically a constant level of sensitivity.

Figure 1B:
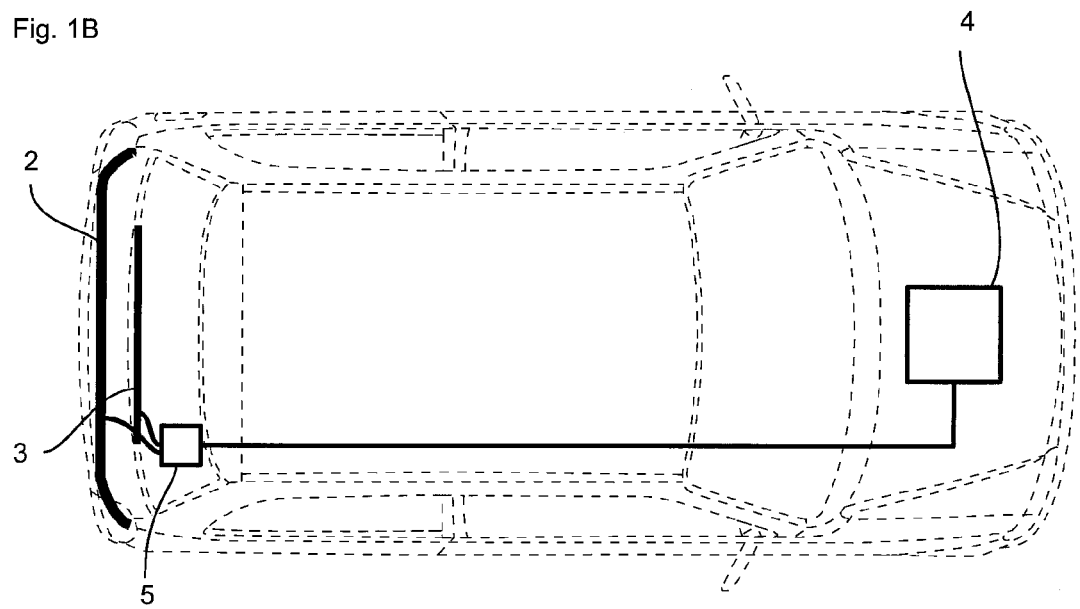
FIG. 1B shows the arrangement from FIG. 1A in a schematic view.

Especially FIG. 1B clearly shows that the electrode 3 is disposed not only lower (i.e., vertically downward in relation to electrode 2) but also further in the direction of the interior of the vehicle. As a result, electrode 3 is located further below the vehicle than electrode 2. Correspondingly, the detection range of electrode 3 is offset further in the direction of the underbody of the vehicle.

FIG. 1A shows that, in the areas in which it protrudes over electrode 3, electrode 2 is bent and guided downward. With its outer portions, electrode 2 reaches the vertical level of extension of electrode 3. In addition, FIG. 1A shows that also in horizontal direction electrode 2 is designed in the outer regions along the longitudinal axis of the vehicle. For example, the electrode 2 follows the body shape of the vehicle, and in the lateral regions it is guided around the corner along the curvature of the bumper.

For example, an operator may desire to swing his lower leg under the bumper. This movement and approach is detected by the extended electrode array 2, as well as by the sensor electrode 3, because the capacitance change is inquired in temporally repeated manner and the change is evaluated. In this example, the frequency of the inquiry of the capacitance change, i.e., the frequency of determining current capacitance values, amounts to 120 Hz (for each capacitance detection a number of charge processes has to be competed—see above).

The different length of the electrodes results in the fact that their respective detection ranges expand laterally to different degrees.

It is obvious that the electrode 2 has a deformed detection range in the lateral regions. According to the invention, the different operating scenarios can be differentiated in different ways.

When a person actuates the hatchback by means of a kicking movement, the response of the system depends on multiple conditions. As described above, according to the invention, the correct sequence (symmetry of actuation) of the electrode signals is monitored, as well as the symmetry regarding the passage of time.

In the edge regions, the areas to which only electrode 2, but not electrode 3, extends, electrode 3 does not respond even when the kicking movement is performed correctly. When a kicking movement is started in this area and during the kicking movement the leg is moved toward the central area of the vehicle, the design of the electrode would cause electrode 2 to have a "considerable time advantage" of detection so that, when the leg is pulled back in this area, which is also the detection range of electrode 2, a temporally asymmetric picture occurs. The time span from detecting the entry of the foot in the detection range of electrode 2 (edge region) until the detection by electrode 3, on the one hand, and leaving the detection range of the electrode 3 (now in the central area of the vehicle) and the detection range of electrode 2, on the other hand, is clearly different and, according to the invention, is rejected as actuation.

Figure 2A:
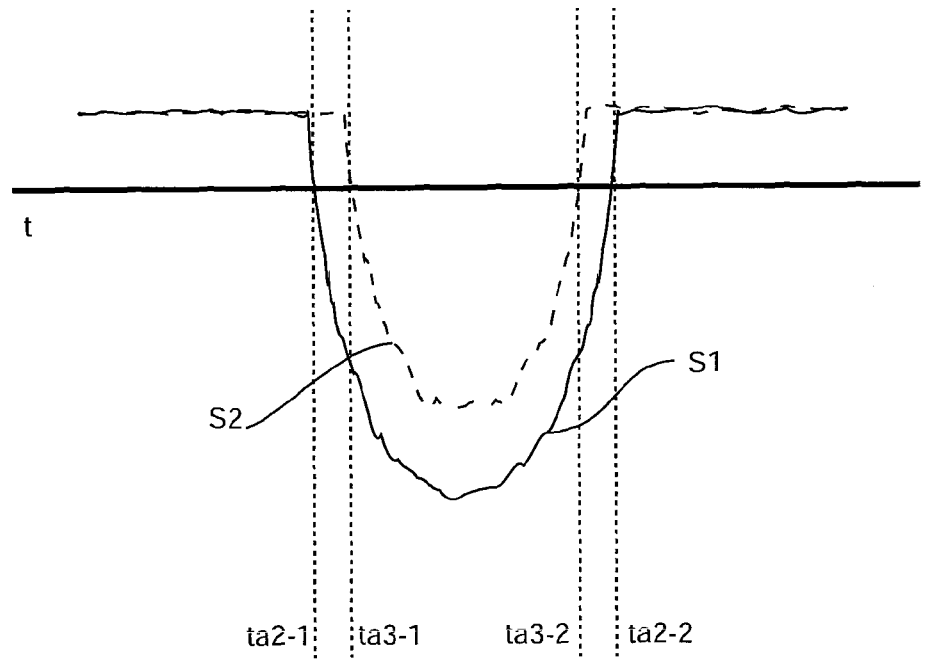

According to the invention, it is also possible to detect unclear actuation movements or lateral movements in the central area. A respective signal response is shown in FIG. 2A. Here the electrode signals of electrodes 2 and 3 are depicted as signals S1 or S2. If an actuation movement is initiated by swinging the lower leg in the direction of the motor vehicle and then pulling the leg back, first electrode 2 responds in that the signal of electrode 2, detected with the control unit 5, increases above a predetermined threshold value. According to the invention, the time Ta2-1 (response of electrode 2) is detected.

The entry of the lower leg or foot in the detection range of electrode 3 is also detected in the control unit 5 by exceeding an associated threshold value (response of electrode 3), namely at the time ta3-1.

When pulling the lower leg back, the leg initially leaves the detection range of electrode 3, and the signal of said electrode stops responding at the time ta3-2 below the threshold value (drop-out of electrode 3). Finally, the lower leg leaves the area of electrode 2 so that also this value decreases again below the threshold value (the time ta2-2/drop-out of electrode 2).

The times when the threshold values are exceeding and falling below are marked in FIG. 2A. According to the invention, the two time differences (ta3-1)−(ta2-1) and (ta2-2)−(ta3-2) are formed, which may deviate by 20 from each other for successfully detecting an allowable actuation movement.

Figure 2B:
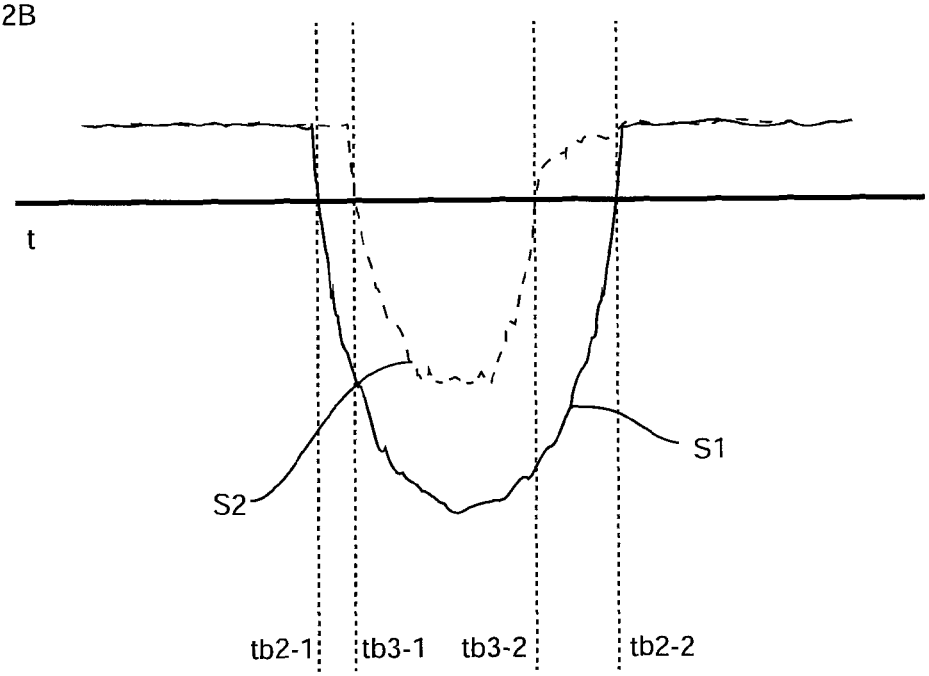

FIG. 2B shows a case in which this criterion is not fulfilled. After swinging his leg, a person moved the foot laterally, thus moving his foot out of the central detection range of the shorter electrode, which results in a lower signal response. Therefore the respective signal distances (ta3-1)−(ta2-1) and (ta2-2)−(ta3-2) deviate by more than the allowable percentage deviation from each other. The signal response in FIG. 2B would not be detected as allowable actuation gesture.

For example, such a signal waveform with asymmetric distances results when a user, for example, in the detection range, is "hopping from one foot to the other" or, for example, when lifting or newly positioning a load, moves his legs (supporting a load with the thighs). Especially when the user has no stability in carrying out a movement a detectable transverse movement comes into the picture. These movements should not be detected as opening actuation so as not to cause undesired opening processes.

According to the invention, it is finally assessed whether the electrodes are deactivated in the opposite order to that in which the entry of an object was recorded in its detection range. This excludes especially undesired movement sequences, for example, animals running underneath the motor vehicle or rolling objects.

It is certainly possible within the scope of actuation detection to perform additional assessment of sensor data. However, the invention relates to exclusion criteria indicating when an actuation has to be rejected as invalid.

The invention claimed is:

1. A sensor array for the detection of movement gestures on a motor vehicle, comprising two sensor electrode arrays which are arranged at spatially offset positions on the motor vehicle, wherein the sensor electrode arrays are elongate and disposed with the same spatial orientation, and at least one control and evaluation device which is coupled to the sensor electrode arrays and detects a change in the capacitance of the sensor electrode arrays in relation to a reference potential, wherein one of the sensor electrode arrays is longer than the other sensor electrode array, wherein the longer sensor electrode array extends in longitudinal direction on both sides over the shorter sensor electrode array, wherein in a horizontal overlapping area the two sensor electrode arrays are vertically spaced from each other, wherein the longer sensor electrode array is deformed in the direction of the shorter sensor electrode array in the region of the sections protruding horizontally over the shorter sensor electrode array, wherein the control and evaluation device is designed in such a way that a time sequence of capacitance values is detected for each of the sensor electrode arrays, and respective times when each sensor electrode array responds and stops responding are recorded, and wherein the time difference between the times when the sensor electrode arrays respond and the time difference between the times when the sensor electrodes stop responding are compared when assessing whether an actuation event has been recorded by the control and evaluation device.

2. A sensor array according to claim 1, wherein an actuation detection is excluded from the control and evaluation device when the time difference between the time of response of the sensor electrode arrays deviates from the time difference between the times when the sensor electrode arrays stop responding by more than 50%.

3. A sensor array according to claim 1, wherein the shorter sensor electrode array is arranged centrally in relation to the longer sensor electrode array and vertically below it, and wherein the outer portions of the longer sensor electrode array are guided downward.

4. A sensor array according to claim 1, wherein the control and evaluation device is designed in such a way that the control and evaluation device assesses whether the sequence of the times of response of the sensor electrode arrays are in the opposite order to the a drop-out time of the respective sensor electrode arrays when assessing whether an actuation event has been recorded.

5. A method for the detection of movement gestures on a motor vehicle comprising providing a capacitive sensor array and at least one control and evaluation device which is coupled to the sensor array and detects a change in the capacitance of the sensor array in relation to the reference potential, wherein two sensor electrode arrays are arranged at spatially offset positions on the motor vehicle, wherein the sensor electrode arrays are elongate and disposed with the same spatial orientation, wherein one of the sensor electrode arrays is longer than the other sensor electrode array, wherein the longer sensor electrode array extends in longitudinal direction on both sides over the shorter sensor electrode array, wherein in a horizontal overlapping area the two sensor electrode arrays are vertically spaced from each other, wherein the longer sensor electrode array is deformed in the direction of the shorter sensor electrode array in the region of the sections protruding horizontally over the shorter sensor electrode array, comprising the following steps:
   a) detecting a time sequence of capacitance values of each of the sensor electrode arrays;
   b) determining the time for the response of each sensor electrode array and a drop-out time of each sensor electrode array;
   c) determining a time difference between the times when the sensor electrode arrays respond;
   d) determining a time difference between the times when the sensor electrode arrays stop responding;
   e) comparing the time difference between steps c) and d);
   f) determining that an invalid actuation has occurred when the comparison results in a deviation between the time difference of step c) and the time difference of step d) is greater than a predetermined tolerance.

6. A Method according to claim 5, wherein it is also assessed whether the sequence of the times of response of the sensor electrode arrays is equal to the reverse sequence of the times when the respective sensor electrode arrays stop responding.

7. A sensor array according to claim 5, wherein the tolerance amounts to 50% of the smaller time difference.

8. A sensor array according to claim 6, wherein the tolerance amounts to 50% of the smaller time difference.

* * * * *